(12) United States Patent
Kim et al.

(10) Patent No.: US 8,598,775 B2
(45) Date of Patent: Dec. 3, 2013

(54) LIGHT EMITTING DEVICE

(75) Inventors: Dae Won Kim, Ansan-si (KR); Do Hyung Kim, Ansan-si (KR); Dae Sung Kal, Ansan-si (KR); In Kyu Park, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 186 days.

(21) Appl. No.: 12/514,761

(22) PCT Filed: Dec. 7, 2007

(86) PCT No.: PCT/KR2007/006343
§ 371 (c)(1),
(2), (4) Date: May 13, 2009

(87) PCT Pub. No.: WO2008/078881
PCT Pub. Date: Jul. 3, 2008

(65) Prior Publication Data
US 2010/0045154 A1    Feb. 25, 2010

(30) Foreign Application Priority Data

Dec. 26, 2006 (KR) .................. 10-2006-0133498
Dec. 29, 2006 (KR) .................. 10-2006-0138489

(51) Int. Cl.
*H01J 1/62* (2006.01)

(52) U.S. Cl.
USPC ........................................... 313/498

(58) Field of Classification Search
USPC .............................................. 313/498; 457/89
See application file for complete search history.

(56) References Cited

U.S. PATENT DOCUMENTS

| 2002/0070681 A1* | 6/2002 | Shimizu et al. ............... 315/246 |
| 2005/0056831 A1* | 3/2005 | Senda et al. .................... 257/40 |
| 2005/0082974 A1* | 4/2005 | Fukasawa et al. ............ 313/512 |
| 2006/0097245 A1* | 5/2006 | Aanegola et al. ............... 257/26 |
| 2006/0138435 A1* | 6/2006 | Tarsa et al. ...................... 257/89 |

FOREIGN PATENT DOCUMENTS

| JP | 2004-006582 | 1/2004 |
| JP | 2005-123484 | 5/2005 |
| KR | 10-2005-0014769 | 2/2005 |
| KR | 10-2005-0088418 | 9/2005 |
| WO | 2004-023568 | 3/2004 |
| WO | WO2006004337 | * 1/2006 |

OTHER PUBLICATIONS

Non-Final Office Action issued for related U.S. Appl. No. 13/151,943 dated May 11, 2012.

* cited by examiner

*Primary Examiner* — Anh T. Mai
*Assistant Examiner* — Brenitra M Lee
(74) *Attorney, Agent, or Firm* — H.C. Park & Associates, PLC (57) ABSTRACT

The disclosed light emitting device comprises at least one first light emitting element including at least one light emitting chip for emitting light having a wavelength of 400 to 500 nm and a phosphor; and at least one second light emitting element disposed adjacent to the first light emitting element to emit light having a wavelength of 560 to 880 nm.

13 Claims, 6 Drawing Sheets

LIGHT EMITTING DEVICE

CROSS-REFERENCE TO RELATED APPLICATIONS

This application is the National Stage of International Application No. PCT/KR2007/006343, filed Dec. 7, 2007, and claims priority from and the benefit of Korean Patent Application No. 10-2006-0133498, filed on Dec. 26, 2006, and Korean Patent Application No. 10-2006-0138489, filed on Dec. 29, 2006, which are all hereby incorporated by reference for all purposes as if fully set forth herein.

BACKGROUND OF THE INVENTION

1. Field of the Invention

The present invention relates to a light emitting device having light emitting elements or light emitting cells for emitting light of a red-based wavelength, which is suitable for improving a Color Rendering Index (CRI) property.

2. Discussion of the Background

Recently, light emitting elements driven under high voltage and AC power have been developed to be used for general illumination. Such a light emitting element has been disclosed in PCT Patent Publication No. WO 2004/023568(A1), entitled "Light-emitting device having light emitting elements" by Sakai et al.

A conventional light emitting element has a plurality of light emitting diodes (hereinafter, referred to as light emitting cells) on a single substrate, and the plurality of light emitting cells are connected in series and reverse parallel through metal wires, which can be used by directly connecting to high voltage or an AC power source.

However, in order to use the conventional light emitting element for illumination, the light emitting element emits blue-based light and the blue-based light is applied to a wavelength converting substance containing a phosphor to be color converted, or the light emitting element is implemented by mixing lights respectively emitted from red, blue and green light emitting elements.

However, since light emitted from the conventional light emitting element has a low CRI, the natural color of an object cannot be clearly shown when the light is thrown on the object.

Figure 1:
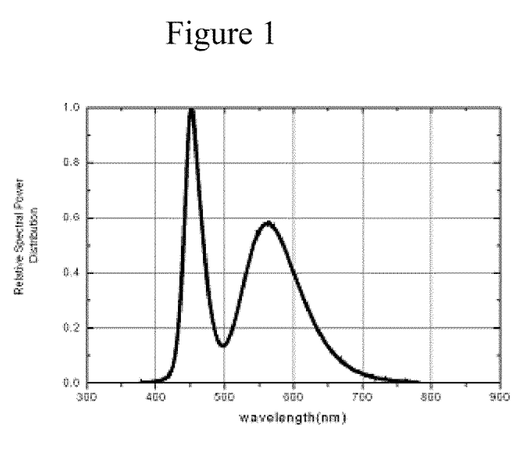
FIG. 1 is a graph showing a CRI property when a yellow phosphor is applied to a light emitting element that emits blue-based light.

FIG. 1 is a graph showing the CRI property when a blue light emitting chip is provided and a wavelength converting substance containing a yellow phosphor is applied to the blue light emitting chip.

Figure 2:
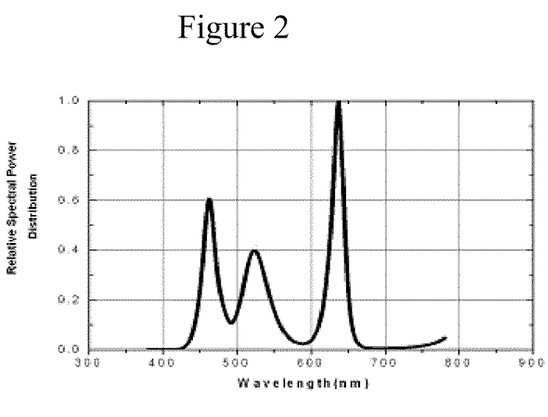
FIG. 2 is a graph showing a CRI property when lights emitted from red, blue and green light emitting elements are mixed.

Meanwhile, FIG. 2 is a graph showing the CRI property when lights emitted from red, blue and green light emitting elements are mixed.

According to the conventional light emitting element, an intensity of red-based light is extremely weak compared with those of blue- and green-based lights. In this case, it is difficult to express a red-based color, and thus the CRI property essential to a light source for illumination may be lowered.

In particular, the CRI property (color rendering) is considered as being very important in the illumination facility market. Thus, it is required to improve the CRI property in order to use a light emitting diode (LED) as a light source for illumination.

SUMMARY OF THE INVENTION

An object of the present invention is to provide a light emitting device suitable for improving the CRI property to use an LED as a light source for illumination.

According to an aspect of the present invention, there is provided a light emitting device, comprising: at least one first light emitting element including at least one light emitting chip for emitting light having a wavelength of 400 to 500 nm and a phosphor; and at least one second light emitting element disposed adjacent to the first light emitting element to emit light having a wavelength of 560 to 880 nm.

Preferably, the first light emitting element is formed as a package type.

Preferably, the first and second light emitting elements are mounted in a molding member containing a phosphor.

Preferably, the first light emitting element is mounted in a first molding member containing a phosphor, and the second light emitting element is mounted in a second molding member formed to cover the first molding member.

Preferably, the first light emitting element comprises a plurality of light emitting cells, the plurality of light emitting cells are connected in series to form at least a first array and at least a second array, and the first and second arrays are connected in reverse parallel to each other.

Preferably, the phosphor includes a yellow phosphor.

According to another aspect of the present invention, there is provided a light emitting device, comprising: a substrate; a plurality of light emitting cells formed on the substrate, each of the light emitting cells having a lower semiconductor layer, an upper semiconductor layer formed on a portion of the lower semiconductor layer and an active layer interposed between the lower and upper semiconductor layers; and wires for electrically connecting the light emitting cells, each of the wires connecting the lower semiconductor layer of one of the light emitting cells to the upper semiconductor layer of another adjacent one of the light emitting cells, wherein at least one of the plurality of light emitting cells emit light having a wavelength of 560 to 880 nm.

Preferably, the plurality of light emitting cells are connected in series to form at least a first array and at least a second array, and the first and second arrays are connected in reverse parallel to each other.

Preferably, the light emitting cells except the light emitting cell for emitting light having a wavelength of 560 to 880 nm emit light having a wavelength of 400 to 500 nm.

Preferably, a wavelength conversion substance for converting a wavelength of light emitted from the light emitting device is additionally disposed to an outside of the light emitting device, and the wavelength conversion substance includes a yellow phosphor.

In the specification of the present invention, the term "Light emitting device" may be a chip or package type device. Thus, a chip-type light emitting element having a plurality of light emitting cells formed therein may be expressed as a light emitting device in some claims or a portion of the detailed description. Further, the term "Light emitting device" may be expressed as a device having at least one light emitting element or at least one LED package. Furthermore, the term "Light emitting element" may be used as an LED chip or an LED package having the LED chip.

According to the present invention, a CRI property necessarily required to use an LED as a light source for illumination can be considerably improved using a light emitting element or a light emitting cell for emitting light having a wavelength of 560 to 880 nm.

According to an embodiment of the present invention, in addition to at least one first light emitting element having at least one light emitting chip for emitting light having a wavelength of 400 to 500 nm and a phosphor, at least one second light emitting element for emitting light having a wavelength of 560 to 880 nm is disposed in various forms, thereby relatively increasing intensity of light having a wavelength of 560 to 880 nm. Accordingly, it is easier to express a color of a wavelength of 560 to 880 nm, and therefore, the CRI property is improved, whereby the LED is suitable for being used as a light source for illumination.

According to another embodiment of the present invention, a light emitting device is provided to have a structure in which at least one of a plurality of light emitting cells formed on a substrate emits light having a wavelength of 560 to 880 nm that is different from the wavelength (particularly, 400 to 500 nm) of other light emitting cells, and therefore, the CRI property is improved at a chip level, whereby a light emitting device suitably used as a light source for illustration can be implemented.

DETAILED DESCRIPTION OF THE ILLUSTRATED EMBODIMENTS

Hereinafter, preferred embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements may be exaggerated for convenience of illustration. Like reference numerals indicate like elements throughout the specification and drawings.

Figure 3:
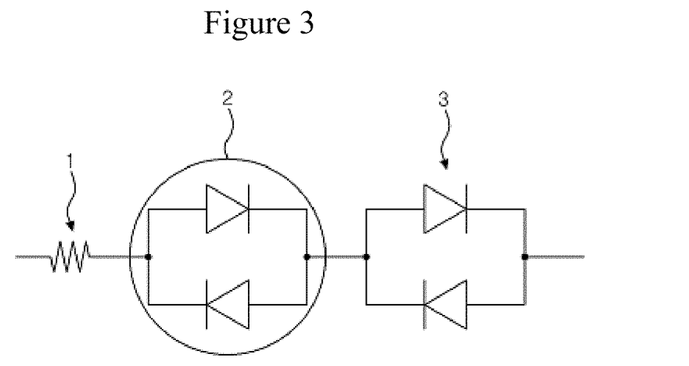
FIG. 3 is a circuit diagram schematically showing a configuration of a light emitting device according to an embodiment of the present invention.

FIG. 3 is a circuit diagram schematically showing a configuration of a light emitting device according to an embodiment of the present invention.

Referring to FIG. 3, the light emitting device according to the embodiment of the present invention comprises a current stabilizing circuit 1, a first light emitting element 2 provided with blue light emitting chips and a yellow phosphor to thereby emit white light, and a second light emitting element 3 provided with red light emitting chips to emit light of a red-based wavelength, which are connected in series.

The first and second light emitting elements 2 and 3 are alternating current (AC) light emitting elements operated by AC power. A plurality of light emitting cells are connected in series or parallel through wires in each of the first and second light emitting elements 2 and 3 and emit light when AC power is supplied.

Each of the light emitting cells provided in the first light emitting element 2 has the blue light emitting chip and the yellow phosphor. Thus, the yellow phosphor converts a color of a portion of the blue light (400 to 500 nm) and emits the converted light with another portion of the blue light, which is unconverted, from the blue light emitting chip provided in each of the light emitting cells, and thus white light is emitted.

At this time, light emitted from the first light emitting element 2 has a wavelength property as shown in FIG. 1.

Meanwhile, each of the light emitting cells provided in the second light emitting element 3 comprises light emitting cells for emitting light of a red-based wavelength (560 to 880 nm). The number of light emitting cells provided in the second light emitting element 3 may be determined depending on a degree of emission of red light. The second light emitting element 3 relatively increases intensity of red-based light. Accordingly, it is easier to express a red-base color, thereby improving a CRI property.

Figure 4:
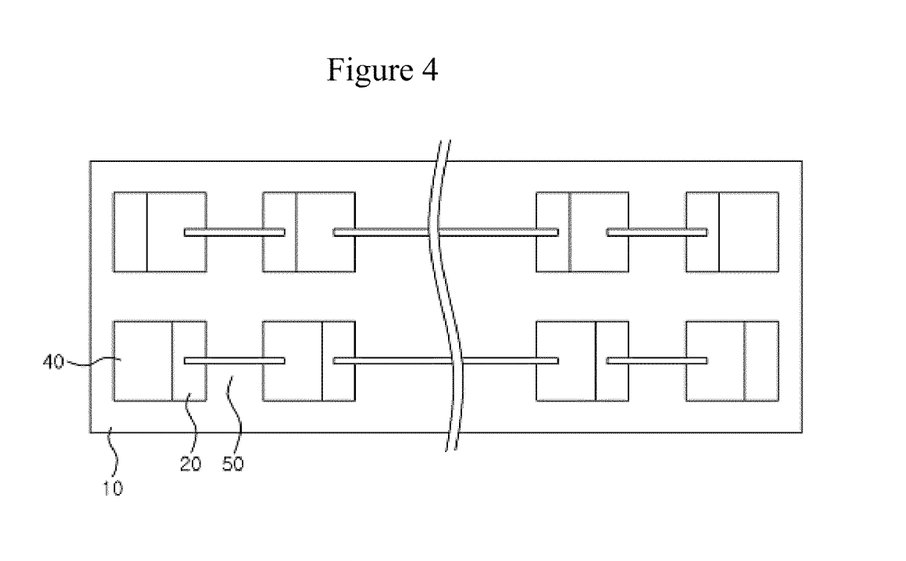
FIG. 4 and FIG. 5 are a plan view and a sectional view illustrating a first light emitting element in FIG. 3, respectively.
Figure 5:
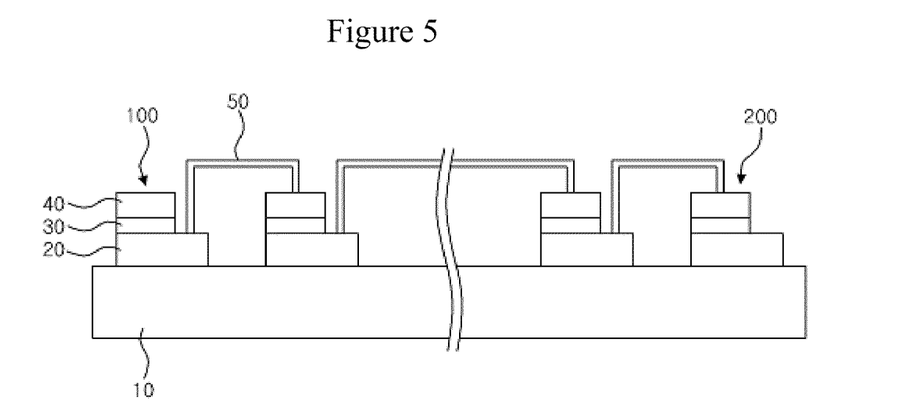

FIGS. 4 and 5 are a plan view and a sectional view, respectively, illustrating the light emitting cells provided in the first light emitting element 2 in FIG. 3. It will be apparent that the light emitting cells provided in the second light emitting element 3 may be fabricated in the same form as the light emitting cells provided in the first light emitting element 2.

Referring to FIGS. 4 and 5, the first light emitting element 2 comprises a plurality of light emitting cells 100 on a substrate 10. Each of the light emitting cells 100 comprises a lower semiconductor layer 20, an active layer 30 formed on a portion of the lower semiconductor layer 20, and an upper semiconductor layer 40 formed on the active layer 30. Meanwhile, a buffer layer (not shown) may be interposed between the substrate 10 and the light emitting cells 100. For example, GaN or AlN may be mainly used as the buffer layer. The lower and upper semiconductor layers 20 and 40 may be n-type and p-type semiconductor layers, or p-type and n-type semiconductor layers, respectively. The active layer 30 may be formed in a single or multiple quantum well structure. A first electrode (not shown) may be formed on a portion of the lower semiconductor layer 20, on which the active layer is not formed, and a second electrode (not shown) may be formed on the upper semiconductor layer 40.

The light emitting cells 100 are connected so that the lower semiconductor layer 20 of one of the light emitting cells 100 is connected to the upper semiconductor layer 40 of another adjacent one of the light emitting cells 100 through a wire 50. At this time, if at least a first array and at least a second array respectively connected in series are formed and then they are connected in reverse parallel with each other, it is possible to suppress generation of flickers even though the light emitting element 2 is connected to an AC power source. The wire 50 may be formed by a process such as a typical step cover or air bridge, but is not limited thereto.

Figure 6:
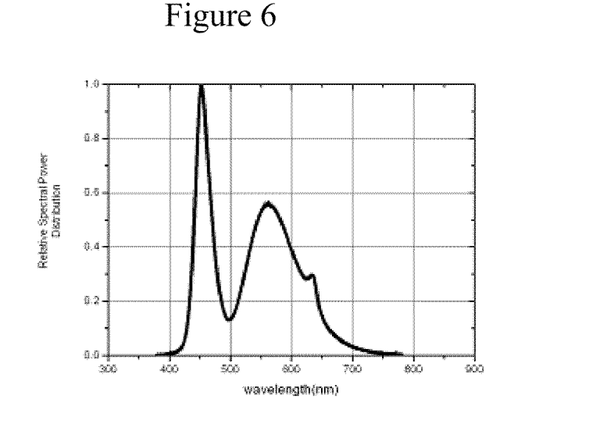
FIG. 6 is a graph showing a CRI property of a light emitting device according to the present invention.

FIG. 6 is a graph showing a relative spectrum power distribution for each wavelength of the light emitting device according to the embodiment of the present invention.

Referring to FIG. 6, the light emitting device has the second light emitting element 3 for emitting light of a red-based wavelength (560 to 880 nm), thereby relatively increasing intensity of red-based light. Accordingly, it is easier to express a red-based color, thereby improving the CRI property.

Figure 7:
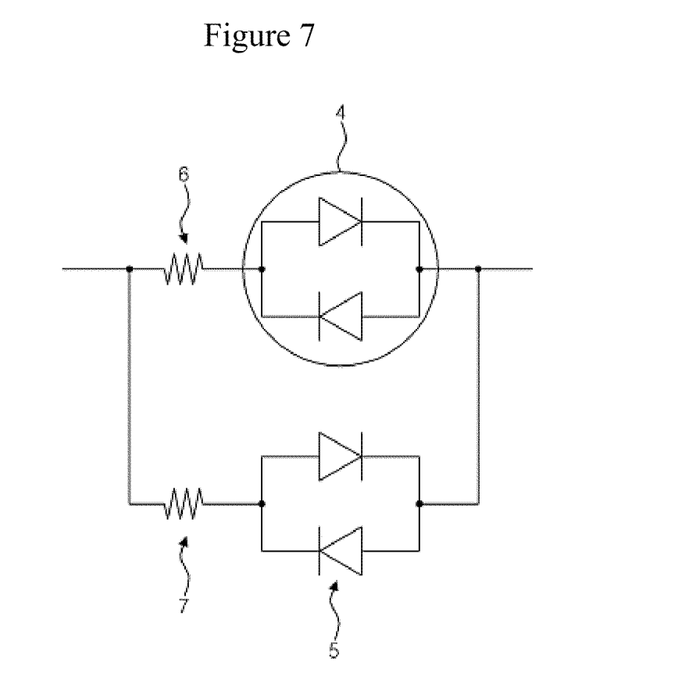
FIG. 7 is a circuit diagram schematically showing a configuration of a light emitting device according to another embodiment of the present invention.

FIG. 7 is a circuit diagram schematically showing a configuration of a light emitting device according to another embodiment of the present invention.

Referring to FIG. 7, the light emitting device according to this embodiment of the present invention comprises a first light emitting element 4 having blue light emitting chips and a yellow phosphor to emit white light, and a second light emitting element 5 having red light emitting chips to emit light of a red-based wavelength. The first and second light emitting elements 4 and 5 respectively have stabilizing circuits 6 and 7 and are connected in parallel.

Figure 8:
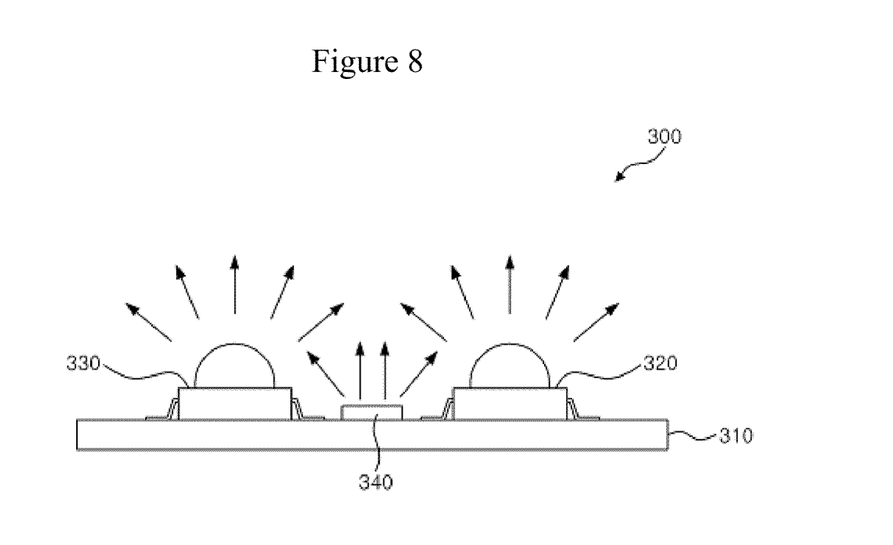
FIG. 8 is a view illustrating a package-type light emitting device according to a further embodiment of the present invention.

FIG. 8 is a view illustrating a light emitting device according to a further embodiment of the present invention.

Referring to FIG. 8, a light emitting device 300 according to the embodiment of the present invention comprises two first light emitting elements 320 and 330 and a second light emitting element 340 disposed between the two first light emitting elements 320 and 330 on a single substrate 310. Each of the first light emitting elements has a blue light emitting chip for emitting light of a blue-based wavelength (400 to 500 nm) and a yellow phosphor, thereby emitting white light, and the second light emitting element 340 has a red light emitting chip for emitting light of a red-based wavelength (560 to 880 nm).

Here, the first light emitting elements 320 and 330 may be light emitting elements that are packaged to be individually used for high power, and the second light emitting element 340 may be a light emitting chip that is not packaged but may be used on a small scale.

Thus, as the second light emitting element 340 for emitting red light is disposed between the two first light emitting elements 320 and 330, a red-based wavelength is effectively compensated, thereby improving the CRI property.

Figure 9:
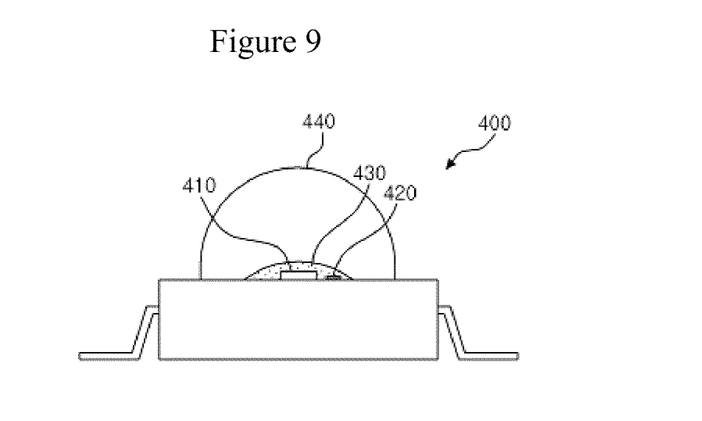
FIG. 9 is a view illustrating a package-type light emitting device according to a still further embodiment of the present invention.

FIG. 9 is a view illustrating a light emitting device according to a still further embodiment of the present invention.

Referring to FIG. 9, a light emitting device 400 according to the embodiment of the present invention comprises a first molding member 430 containing a yellow phosphor.

In the first molding member 430, a first light emitting element 410 having a blue light emitting chip for emitting light of a blue-based wavelength (400 to 500 nm) and a second light emitting element 420 having a red light emitting chip for emitting light of a red-based wavelength (560 to 880 nm) are disposed on one slug (not shown). A second molding member 440 surrounds and protects the first molding member 430.

As the first and second light emitting elements 410 and 420 are disposed in one molding member, it is possible to reduce a mounting area thereof. In addition, a red-based wavelength can be effectively compensated, thereby improving the CRI property.

The present invention is not limited to the aforementioned embodiments and various modifications and changes can be made thereto by those skilled in the art. The modifications and changes are covered by the spirit and scope of the invention defined by the appended claims.

For example, the first and second light emitting elements 410 and 420 are disposed together in the molding member 430 containing the phosphor in the embodiment of the present invention shown in FIG. 9. However, as a modification, the first light emitting element 410 may be mounted in the first molding member 430 containing the phosphor, and the second light emitting element 420 may be mounted in the second molding member 440 covering the first molding member 430.

Hereinafter, light emitting devices according to further embodiments of the present invention will be described, which are configured so that one of a plurality of light emitting cells formed on a substrate emits light of a red-based wavelength (560 to 880 nm).

Figure 10:
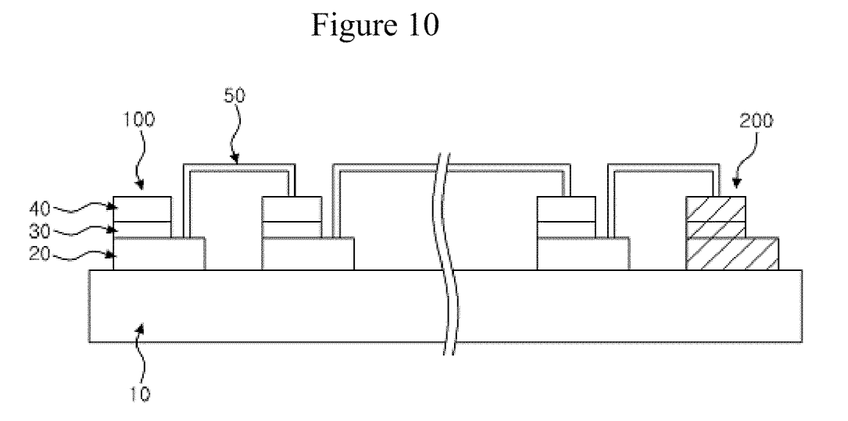
FIG. 10 is a sectional view showing a light emitting element according to an embodiment of the present invention.
Figure 11:
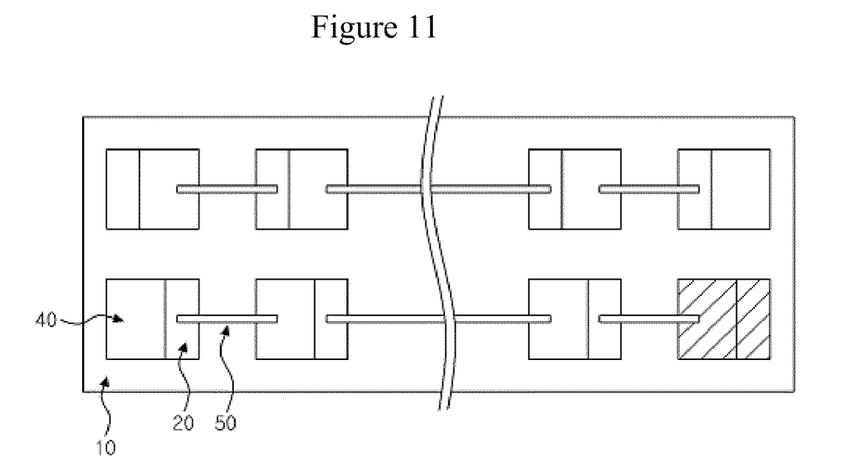
FIG. 11 is a plan view showing the light emitting element according to the embodiment of the present invention.

FIGS. 10 and 11 are a sectional view and a plan view of a light emitting element having a light emitting cell for emitting light of a red-based wavelength, respectively.

Referring to FIGS. 10 and 11, a plurality of light emitting cells 100 are formed on a substrate 10. Each of the light emitting cells 100 comprises a lower semiconductor layer 20, an active layer 30 formed on a portion of the lower semiconductor layer 20, and an upper semiconductor layer 40 formed on the active layer 30. Meanwhile, a buffer layer (not shown) may be interposed between the substrate 10 and the light emitting cells 100. For example, GaN or AlN may be mainly used as the buffer layer. The lower and upper semiconductor layers 20 and 40 may be n-type and p-type semiconductor layers, or p-type and n-type semiconductor layers, respectively. The active layer 30 may be formed in a single or multiple quantum well structure. A first electrode (not shown) may be formed on a portion of the lower semiconductor layer 20, on which the active layer 30 is not formed, and a second electrode (not shown) may be formed on the upper semiconductor layer 40.

The light emitting cells are connected so that the lower semiconductor layer 20 of one of the light emitting cells 100 is connected to the upper semiconductor layer 40 of another adjacent one of the light emitting cells 100 through a wire 50. At this time, if at least a first array and at least a second array respectively connected in series are formed and then they are connected in reverse parallel with each other, it is possible to suppress generation of flickers even though the light emitting element 4 is connected to an AC power source. The wire 50 may be formed by a process such as a typical step cover or air bridge, but is not limited thereto.

As described above, FIG. 1 is a graph showing a CRI property when a wavelength converting substance containing a yellow phosphor is applied to a blue light emitting element for emitting light of a blue-based wavelength (400 to 500 nm). Referring back to FIG. 1, intensity of red-based light is extremely weak as compared with blue- and green-based lights. In this case, it is difficult to express a red-based color, and thus, the CRI property essential to a light source for illumination may be lowered.

If at least one of the plurality of light emitting cells 100 is formed as a light emitting cell 200 for emitting light of a red-based wavelength (560 to 880 nm) as shown in FIGS. 10 and 11, the CRI property with which the intensity of red-based light is relatively increased is obtained as shown in FIG. 6. Accordingly, it is easier to express a red-based color, thereby improving the CRI property.

As described above, the method of forming at least one of the plurality of light emitting cells 100 as the light emitting cell 200 for emitting light of a red-based wavelength is not limited particularly. For example, it is possible to use a method of removing at least one of the plurality of light emitting cells 100 through a laser lift-off (LLO) process and then bonding a light emitting cell 200 for emitting light of a red-based wavelength to the place where the light emitting cell 100 is removed.

Although a light emitting cell 200 for emitting light of a red-based wavelength is positioned at the edge of the array in the embodiment of the present invention, this is provided only for illustrative purposes, and the light emitting cell 200 may be positioned inside of the array.

Figure 12:
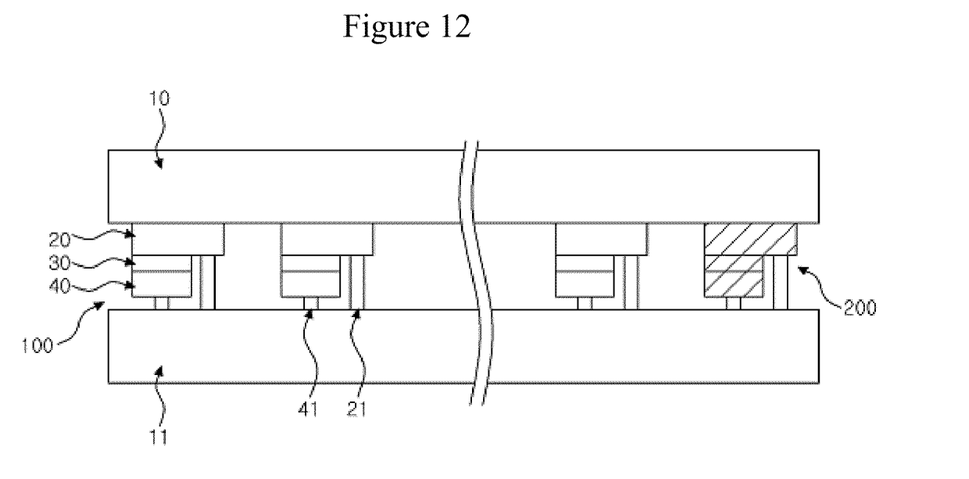
FIG. 12 is a sectional view showing a light emitting element according to another embodiment of the present invention.

FIG. 12 is a sectional view showing a light emitting element according to a further embodiment of the present invention.

Referring to FIG. 12, a plurality of light emitting cells 100 are formed on a substrate 10. Each of the light emitting cells 100 comprises a lower semiconductor layer 20, an active layer 30 formed on a portion of the lower semiconductor layer 20, and an upper semiconductor layer 40 formed on the active layer 30. Meanwhile, a buffer layer (not shown) may be interposed between the substrate 10 and the light emitting cells 100. The lower and upper semiconductor layers 20 and 40 may be n-type and p-type semiconductor layers, or p-type and n-type semiconductor layers, respectively. The active layer 30 may be formed in a single or multiple quantum well structure.

The plurality of light emitting cells 100 formed on the substrate 10 are flip bonded onto a submount substrate 11 through first and second bumps 21 and 41. At this time, at least one of the plurality of light emitting cells 100 formed on the substrate 10 may be replaced with a light emitting cell 200 for emitting light of a red-based wavelength (560 to 880 nm).

A light emitting element having a plurality of flip-chip type light emitting cells 100 and 200 with superior color rendering can be fabricated by the method described above.

The invention claimed is:

1. A light emitting device, comprising:
    at least one first light emitting element comprising at least one light emitting chip and a phosphor, the at least one light emitting chip to emit light having a wavelength in a range from 400 to 500 nm; and
    at least one second light emitting element disposed adjacent to the first light emitting element to emit light having a wavelength in a range from 560 to 880 nm,
    wherein the first light emitting element and the second light emitting element are disposed in a molding member containing the phosphor,
    wherein the first light emitting element is disposed in a first molding member containing the phosphor, and the second light emitting element is disposed in a second molding member disposed to cover the first molding member and the second molding member is domed shape,
    wherein the phosphor comprises a yellow phosphor,
    wherein the at least one second light emitting element is unobstructed, and
    wherein the first light emitting element comprises a plurality of light emitting cells, and the plurality of light emitting cells are connected in series to form at least a first array and at least a second array, the first array and the second array being connected in reverse parallel to each other, and the first light emitting element being connected in series or parallel to the second light emitting element.

2. The light emitting device of claim 1, wherein the first light emitting element is a package type.

3. A light emitting device, comprising:
    a substrate;
    a plurality of light emitting cells formed on the substrate, each of the light emitting cells comprising a lower semiconductor layer, an upper semiconductor layer disposed on a portion of the lower semiconductor layer, and an active layer interposed between the lower semiconductor layer and the upper semiconductor layer; and
    wires electrically connecting the light emitting cells, each of the wires connecting the lower semiconductor layer of one of the light emitting cells to the upper semiconductor layer of another adjacent one of the light emitting cells,
    wherein at least one of the plurality of light emitting cells emits light having a wavelength in a range from 560 to 880 nm,
    wherein the at least one of the plurality of light emitting cells that emits light having a wavelength in a range from 560 to 880 nm is unobstructed.

4. The light emitting device of claim 3, wherein the plurality of light emitting cells are connected in series to form at least a first array and at least a second array, and the first array and the second array being connected in reverse parallel to each other.

5. The light emitting device of claim 3, wherein the light emitting cells except the light emitting cell that emits light having the wavelength in the range from 560 to 880 nm, emit light having a wavelength in a range from 400 to 500 nm.

6. The light emitting device of claim 3, further comprising a wavelength conversion substance disposed on the outside of the light emitting device, the wavelength conversion substance to convert a wavelength of light emitted from the light emitting device.

7. The light emitting device of claim 6, wherein the wavelength conversion substance comprises a yellow phosphor.

8. The light emitting device of claim 4, further comprising a wavelength conversion substance disposed on the outside of the light emitting device, the wavelength conversion substance to convert a wavelength of light emitted from the light emitting device.

9. The light emitting device of claim 5, further comprising a wavelength conversion substance disposed on the outside of the light emitting device, the wavelength conversion substance to convert a wavelength of light emitted from the light emitting device.

10. The light emitting device of claim 1, wherein the second molding member does not contain any phosphor.

11. A light emitting device, comprising:
    at least one first light emitting element comprising:
        a substrate,
        a plurality of light emitting cells formed on the substrate, each of the light emitting cells comprising a lower semiconductor layer, an upper semiconductor layer disposed on a portion of the lower semiconductor layer, and an active layer interposed between the lower semiconductor layer and the upper semiconductor layer, and
        wires electrically connecting the light emitting cells, each of the wires connecting the lower semiconductor layer of one of the light emitting cells to the upper semiconductor layer of another adjacent one of the light emitting cells,
        wherein the plurality of light emitting cells emit light having a wavelength in a range from 400 to 500 nm;
    at least one second light emitting element disposed adjacent to the plurality of light emitting cells to emit light having a wavelength in a range from 560 to 880 nm,
    wherein the first light emitting element and the second light emitting element are disposed in a molding member containing the phosphor,
    wherein the phosphor comprises a yellow phosphor.

12. The light emitting device of claim 11, wherein the plurality of light emitting cells formed on the substrate are flip bonded onto a submount substrate through bumps.

13. The light emitting device of claim 11, wherein the at least one second light emitting element is unobstructed.

* * * * *